(12) United States Patent
Shimura et al.

(10) Patent No.: US 10,964,606 B2
(45) Date of Patent: Mar. 30, 2021

(54) FILM FORMING SYSTEM, FILM FORMING METHOD, AND COMPUTER STORAGE MEDIUM

(71) Applicant: Tokyo Electron Limited, Tokyo (JP)

(72) Inventors: Satoru Shimura, Koshi (JP); Masashi Enomoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/481,136

(22) PCT Filed: Jan. 4, 2018

(86) PCT No.: PCT/JP2018/000031
§ 371 (c)(1),
(2) Date: Jul. 26, 2019

(87) PCT Pub. No.: WO2018/146981

PCT Pub. Date: Aug. 16, 2018

(65) Prior Publication Data
US 2019/0355573 A1    Nov. 21, 2019

(30) Foreign Application Priority Data

Feb. 7, 2017    (JP) .............................. JP2017-020253

(51) Int. Cl.
*H01L 21/66* (2006.01)
*G03F 7/16* (2006.01)
(Continued)

(52) U.S. Cl.
CPC .............. *H01L 22/20* (2013.01); *G03F 7/168* (2013.01); *H01L 21/0274* (2013.01); *H01L 21/02118* (2013.01)

(58) Field of Classification Search
None
See application file for complete search history.

(56) References Cited

U.S. PATENT DOCUMENTS

| 7,250,309 | B2 * | 7/2007 | Mak | G03F 1/30 |
| | | | | 216/12 |
| 9,153,459 | B2 * | 10/2015 | Kyuho | H01L 21/32155 |
| 9,741,559 | B2 * | 8/2017 | Shimura | H01L 21/31055 |
| 10,430,719 | B2 * | 10/2019 | David | G03F 7/70625 |

(Continued)

FOREIGN PATENT DOCUMENTS

| JP | H07-201823 A | 8/1995 |
| JP | 2004-186682 A | 7/2004 |

(Continued)

OTHER PUBLICATIONS

Ruegsegger, S., A. Wagner, J.S. Freudenberg, and D.s. Grimard. "Feedforward Control for Reduced Run-to-Run Variation in Microelectronics Manufacturing." IEEE Transactions on Semiconductor Manufacturing 12, No. 4 (1999): 493-502. https://doi.org/10.1109/66.806127. (Year: 1999).*

(Continued)

*Primary Examiner* — J. E. Schoenholtz
(74) *Attorney, Agent, or Firm* — Posz Law Group, PLC

(57) ABSTRACT

A film forming system is to form an organic film on a substrate having a pattern formed on a surface thereof, includes: an organic film formation section configured to perform an organic film formation treatment on the substrate to form the organic film on the substrate; a film thickness measurement section configured to measure a film thickness of the organic film on the substrate; and an ultraviolet treatment section configured to perform an ultraviolet irradiation treatment on the organic film on the substrate to remove a surface of the organic film. In the film forming system, the organic film formation section, the film thickness measurement section, and the ultraviolet treatment section are disposed side by side in this order along a transfer direction of the substrate.

3 Claims, 15 Drawing Sheets

(51) Int. Cl.
*H01L 21/02* (2006.01)
*H01L 21/027* (2006.01)

(56) References Cited

U.S. PATENT DOCUMENTS

| | | | | |
|---|---|---|---|---|
| 2002/0197745 | A1* | 12/2002 | Shanmugasundram | ..................... B24B 37/013 438/5 |
| 2011/0070665 | A1* | 3/2011 | Chen | ................. H01J 37/32935 438/5 |
| 2014/0279750 | A1* | 9/2014 | Iliopoulos | ........... C23C 16/4405 706/12 |
| 2015/0301100 | A1* | 10/2015 | Valcore, Jr. | ....... H01J 37/32926 702/59 |
| 2015/0357188 | A1* | 12/2015 | Shimura | ........... H01L 21/31055 438/5 |

FOREIGN PATENT DOCUMENTS

| | | |
|---|---|---|
| JP | 2014-165252 A | 9/2014 |
| JP | 2016-015371 A | 1/2016 |

OTHER PUBLICATIONS

Haupt, Ronny & Zhiming, Jiang & Haensel, Leander & Mueller, Ulf & Mayer, Ulrich. (2011). Inline control of an ultra low-k ILD layer using Broadband Spectroscopic Ellipsometry. 1-6. 10.1109/ASMC. 2011.5898172. (Year: 2011).*

Coater.Developer LITHIUS (tm) Series, downloaded from URL<https://www.tel.com/product/lithius.html> on Sep. 14, 2020.*

International Search Report dated Apr. 3, 2018 issued in corresponding international patent application No. PCT/JP2018/000031 (and English translation).

* cited by examiner

FILM FORMING SYSTEM, FILM FORMING METHOD, AND COMPUTER STORAGE MEDIUM

TECHNICAL FIELD

Cross-Reference to Related Applications

This application is based upon and claims the benefit of priority of the prior Japanese Patent Application No. 2017-20253, filed in Japan on Feb. 7, 2017, the entire contents of which are incorporated herein by reference.

The present invention relates to a film forming system, a film forming method, and a computer storage medium for forming an organic film on a substrate having a pattern formed on a surface thereof.

BACKGROUND ART

In a photolithography step in a manufacturing process of a semiconductor device, for example, in a multilayer wiring structure, a coating treatment of supplying a coating solution, for example, onto the surface of a semiconductor wafer (hereinafter, referred to as a "wafer") as a substrate to form an anti-reflection film or a resist film, an exposure treatment of exposing the resist film to a predetermined pattern, a developing treatment of developing the exposed resist film, a thermal treatment of heating the wafer and so on are performed in sequence to thereby form a predetermined resist pattern on the wafer. Then, an etching treatment is performed using the resist pattern as a mask, and then a removal treatment of the resist film or the like is performed to form a predetermined pattern on the wafer. The step of forming the predetermined pattern in a predetermined layer is repeatedly performed a plurality of times to manufacture the semiconductor device in the multilayer wiring structure.

Incidentally, in a case where the predetermined pattern is repeatedly formed on the wafer as described above, in order to form a resist film in an (n+1)-th layer at an appropriate height after the predetermined pattern is formed in an n-th layer, a surface to be coated with the resist solution needs to be flat.

Hence, conventionally, an organic film such as an SOC (Spin On Carbon) film or the like is formed on the predetermined pattern on the wafer to flatten a surface of the organic film.

In a method disclosed in Patent Document 1, an organic material is applied onto the wafer having a pattern formed on a surface thereof and the organic material is subjected to a thermal treatment to form into an organic film on the wafer. Then, the organic film is irradiated with ultraviolet rays, a surface of the organic film is removed until the surface of the pattern is exposed, namely, etched back, whereby flattening is achieved.

PRIOR ART DOCUMENT

Patent Document

Patent Document 1: Japanese Laid-open Patent Publication No. 2014-165252

DISCLOSURE OF THE INVENTION

Problems to be Solved by the Invention

However, for condition setting of the etch back, conventionally, a cross sectional SEM (Scanning Electron Microscope) of the like is used, and the condition setting requires labor and long time because of the need to break the wafer or the like.

The present invention has been made in consideration of the above points, and its object is to provide a film forming system allowing easy condition setting of etch back of an organic film, and a film forming method and a computer storage medium using the film forming system.

Means for Solving the Problems

To achieve the above object, an aspect of the present invention is a film forming system for forming an organic film on a substrate having a pattern formed on a surface thereof, the film forming system including: an organic film formation section configured to perform an organic film formation treatment on the substrate to form the organic film on the substrate; a film thickness measurement section configured to measure a film thickness of the organic film on the substrate; and an ultraviolet treatment section configured to perform an ultraviolet irradiation treatment on the organic film on the substrate to remove a surface of the organic film, wherein the organic film formation section, the film thickness measurement section, and the ultraviolet treatment section are disposed side by side in this order along a transfer direction of the substrate.

An aspect of the present invention according to another viewpoint is a film forming method of forming an organic film on a substrate having a pattern formed on a surface thereof, the film forming method including: performing an organic film formation treatment on the substrate to form the organic film on the substrate; removing a surface of the organic film formed by the organic film formation treatment, by an ultraviolet irradiation treatment; measuring a film thickness of the organic film from which the surface has been removed by the removing; and further removing a surface of the organic film from which the surface has been removed, when the measurement result does not satisfy a predetermined condition.

An aspect of the present invention according to still another viewpoint is a film forming method of forming an organic film on a substrate having a pattern formed on a surface thereof, the film forming method including: performing an organic film formation treatment on the substrate to form the organic film on the substrate; removing a surface of the organic film formed by the organic film formation treatment, by an ultraviolet irradiation treatment; and measuring a film thickness of the organic film on the substrate, wherein a treatment condition in the organic film formation treatment or in the ultraviolet irradiation treatment is adjusted based on a measurement result at the measuring the film thickness of the organic film.

A present invention according to still another viewpoint is a computer-readable storage medium storing a program running on a computer of a controller configured to control a film forming system to cause the film forming system to execute a film forming method of forming an organic film on a substrate having a pattern formed on a surface thereof, the film forming method including: performing an organic film formation treatment on the substrate to form the organic film on the substrate; removing a surface of the organic film formed by the organic film formation treatment, by an ultraviolet irradiation treatment; measuring a film thickness of the organic film from which the surface has been removed by the removing; and further removing a surface of the organic film from which the surface has been removed, when the measurement result does not satisfy a predetermined condition.

A present invention according to still another viewpoint is a computer-readable storage medium storing a program running on a computer of a controller configured to control a film forming system to cause the film forming system to execute a film forming method of forming an organic film on a substrate having a pattern formed on a surface thereof, the film forming method including: performing an organic film formation treatment on the substrate to form the organic film on the substrate; removing a surface of the organic film formed by the organic film formation treatment, by an ultraviolet irradiation treatment; and measuring a film thickness of the organic film on the substrate, wherein a treatment condition in the organic film formation treatment or in the ultraviolet irradiation treatment is adjusted based on a measurement result at the measuring the film thickness of the organic film.

Effect of the Invention

According to the film forming system of the present invention, the condition setting of the etch back of an organic film can be easily performed.

EMBODIMENTS FOR CARRYING OUT THE INVENTION

Hereinafter, an embodiment of the present invention will be explained. Note that, in the description and the drawings, the same codes are given to components having substantially the same functional configurations to omit duplicated explanation.

First Embodiment

Figure 1:
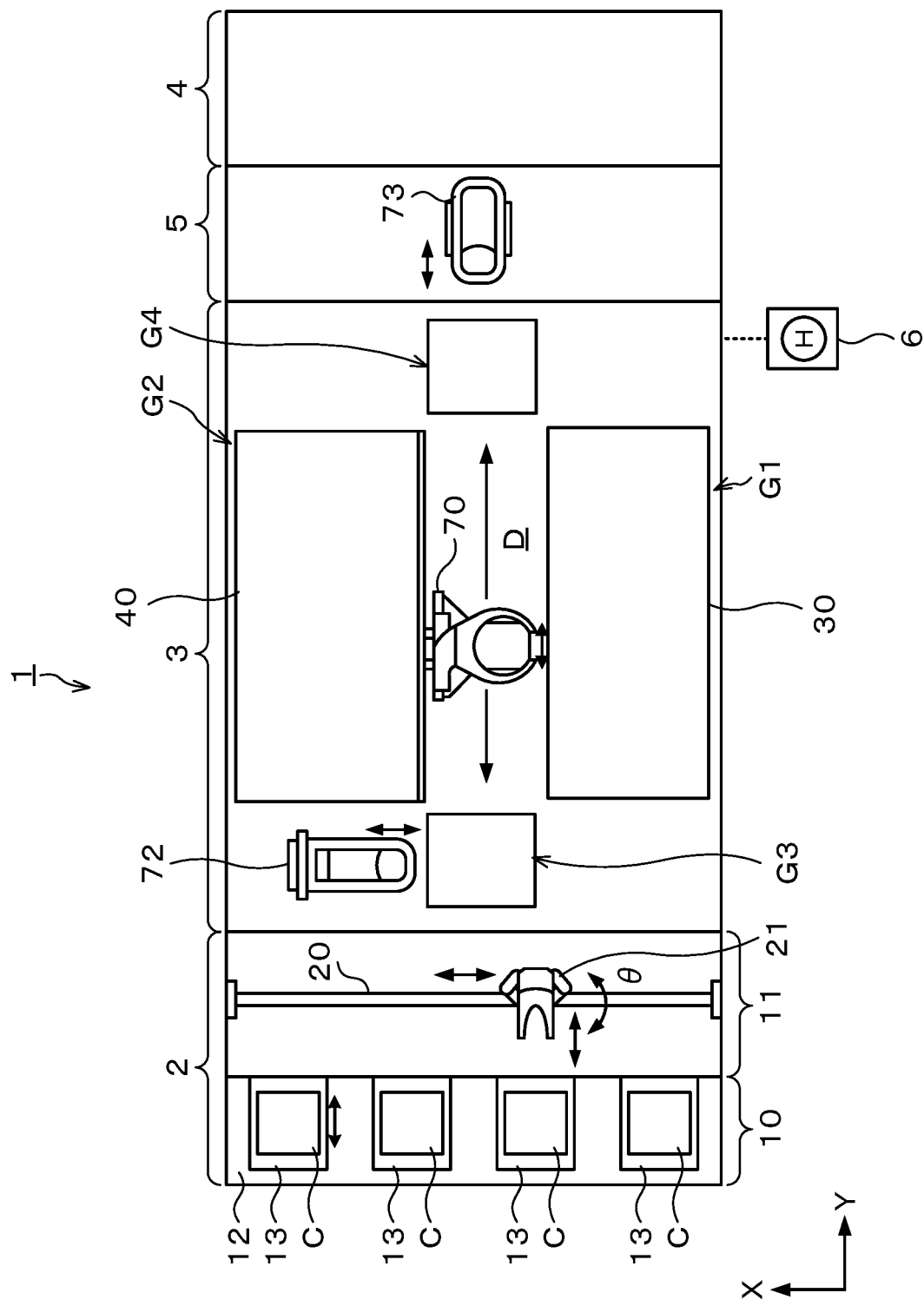
FIG. 1 is a plan view illustrating the outline of a configuration of a film forming system according to a first embodiment of the present invention.
Figure 2:
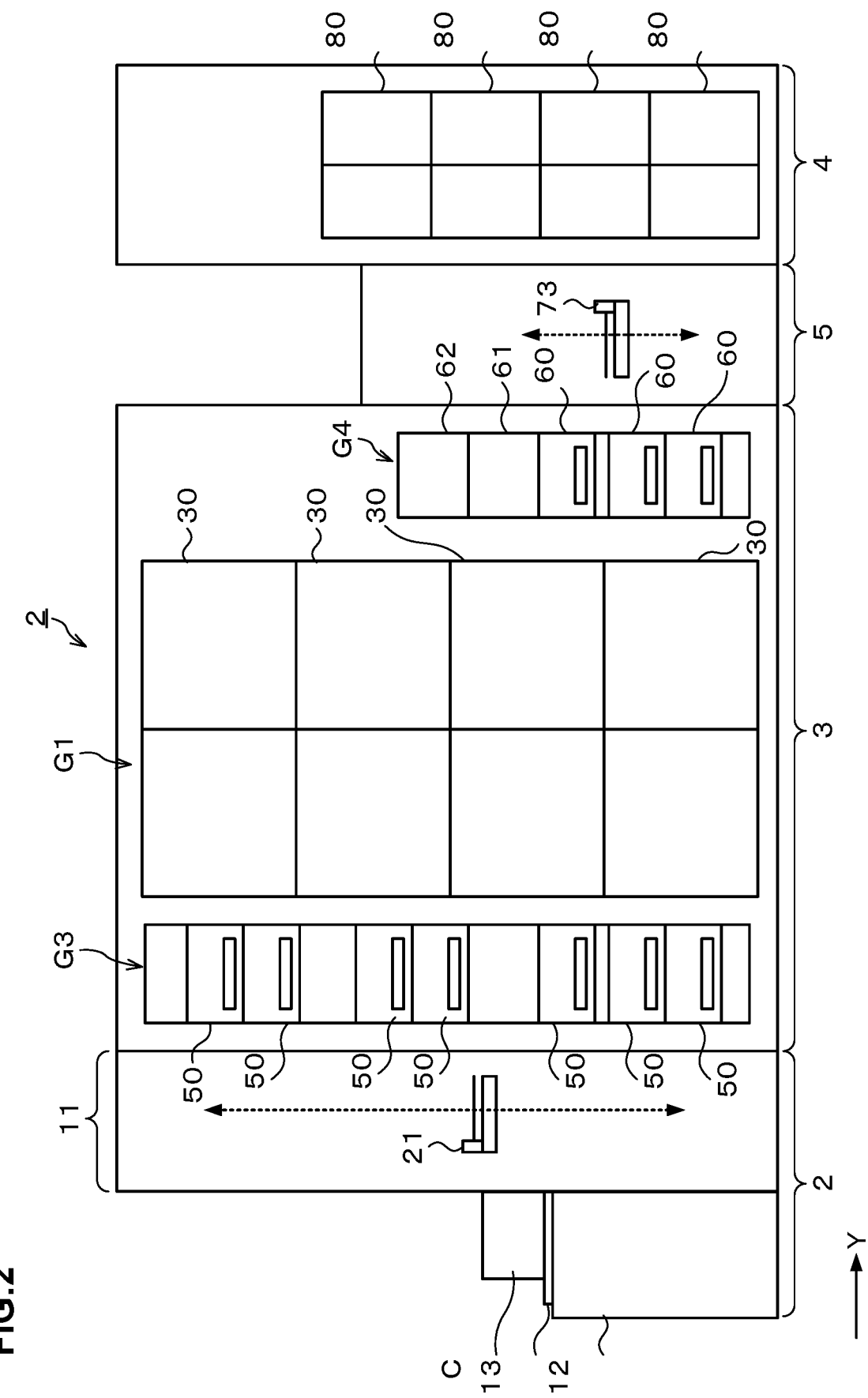
FIG. 2 is a side view illustrating the outline of an internal configuration of the film forming system according to the first embodiment of the present invention.
Figure 3:
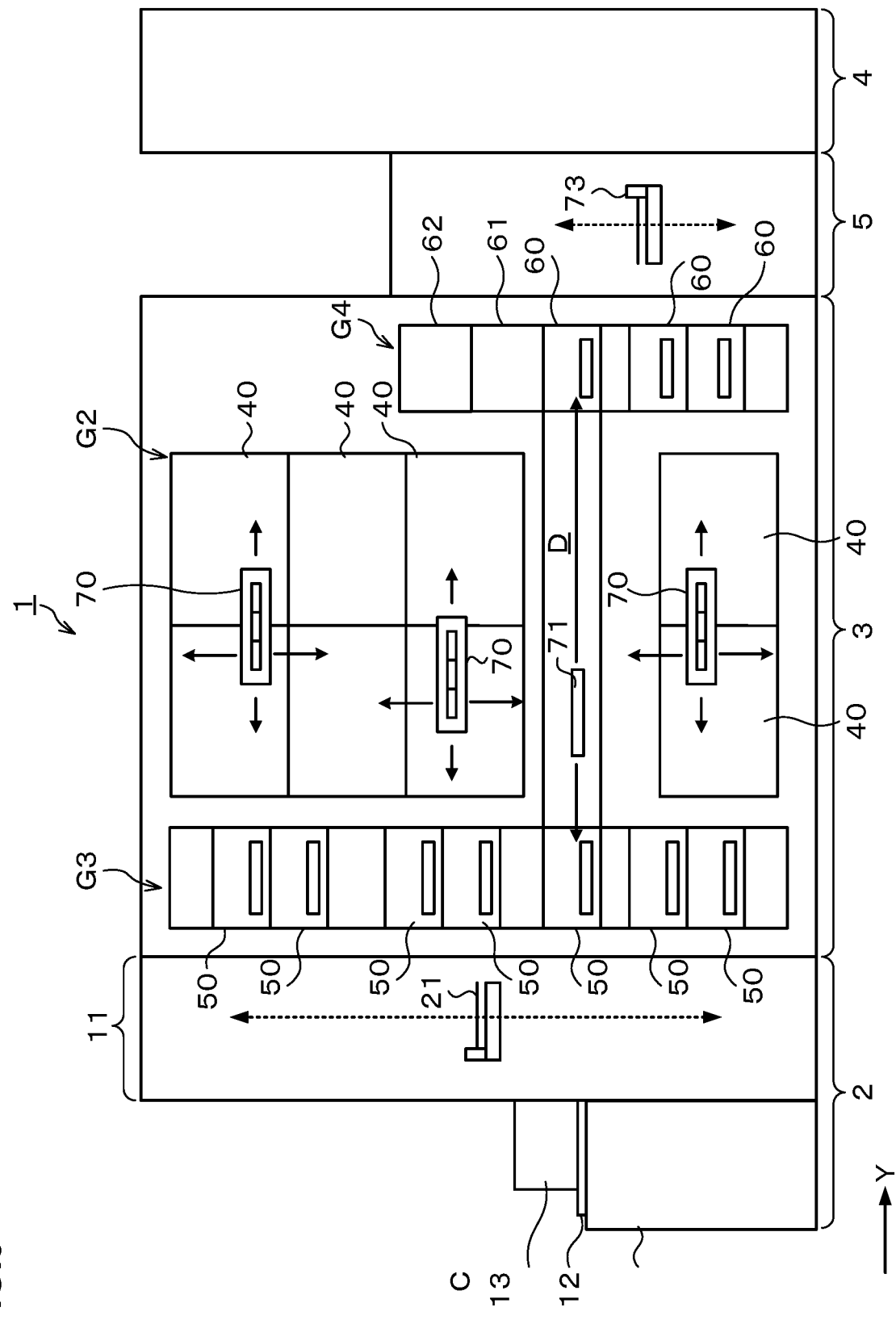
FIG. 3 is a side view illustrating the outline of the internal configuration of the film forming system according to the first embodiment of the present invention.

FIG. 1 is an explanatory view illustrating the outline of an internal configuration of a film forming system 1 according to a first embodiment. FIG. 2 and FIG. 3 are side views illustrating the outline of the internal configuration of the film forming system 1. Note that an example in which the film forming system 1 forms an SOC film as an organic film on a wafer W as a substrate will be explained in the following. The thickness of the SOC film formed by the film forming system 1 is several tens of micrometers to several tens of nanometers. Note that on the wafer to be treated in the film forming system 1, predetermined patterns of a silicon oxide film ($SiO_2$ film) or the like have been formed in advance.

The film forming system 1 has, for example, as illustrated in FIG. 1, a configuration in which a cassette station 2 as a transfer in/out section into/out of which a cassette C is transferred from/to the outside, a processing station 3 including various treatment units which perform predetermined treatments such as a coating treatment of an organic material, an etching station 4 which performs etching back, and an interface station 5 which delivers the wafer W between the processing station 3 and the etching station 4, are integrally connected. Further, the film forming system 1 has a controller 6 which controls the film forming system 1.

The cassette station 2 is divided, for example, into a cassette transfer in/out section 10 and a wafer transfer section 11. The cassette transfer-in/out section 10 is provided, for example, at an end on a Y-direction negative direction (left direction in FIG. 1) side of the film forming system 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (up-down direction in FIG. 1).

On the stage plates 13, cassettes C can be mounted when the cassettes C are transferred in/out from/to the outside of the film forming system 1.

In the wafer transfer section 11, a wafer transfer apparatus 21 is provided which is movable on a transfer path 20 extending in the X-direction as illustrated in FIG. 1. The wafer transfer apparatus 21 is movable also in an up-down direction and around a vertical axis (in a θ-direction), and can transfer the wafer W between the cassette C on each of the stage plates 13 and later-described delivery units included in a third block G3 in the processing station 3.

In the processing station 3, a plurality of, for example, four blocks G1, G2, G3, G4 each including various units are provided. For example, the first block G1 is provided on the front side (an X-direction negative direction side in FIG. 1) in the processing station 3, and the second block G2 is provided on the rear side (an X-direction positive direction side in FIG. 1) in the processing station 3. Further, the third block G3 is provided on the cassette station 2 side (a Y-direction negative direction side in FIG. 1) in the processing station 3, and the fourth block G4 is provided on the interface station 5 side (a Y-direction positive direction side in FIG. 1) in the processing station 3.

In the first block G1, as illustrated in FIG. 2, coating treatment units 30 are provided at four tiers each in two rows. The coating treatment unit 30 is to coat the wafer W with the organic material for forming the organic film. Note that the organic material is liquid obtained by, for example, dissolving a composition of the SOC film being the organic film in a predetermined solvent.

In the second block G2, as illustrated in FIG. 3, thermal treatment units 40 each of which performs a thermal treatment on the wafer W are provided at four tiers each in two rows.

In the third block G3, delivery units 50 are provided. Further, delivery apparatuses 60, a first film thickness measurement unit 61, and a second film thickness measurement unit 62 are provided in order from the bottom in the fourth block G4.

As illustrated in FIG. 1, a wafer transfer region D is formed in a region surrounded by the first block G1 to the fourth block G4. In the wafer transfer region D, for example, a wafer transfer apparatus 70 is disposed.

The wafer transfer apparatus 70 has a transfer arm movable, for example, in the Y-direction, the front-back direction, the θ-direction, and the up-down direction. The wafer transfer apparatus 70 can move in the wafer transfer region D to transfer the wafer W to predetermined units in the first block G1, the second block G2, the third block G3 and the fourth block G4 therearound. For example, a plurality of the wafer transfer apparatuses 70 are disposed one above the other as illustrated in FIG. 3, and each of them can transfer the wafer W to a predetermined unit at a height of the same level in each of the blocks G1 to G4.

Further, in the wafer transfer region D, a shuttle transfer apparatus 71 is provided which linearly transfers the wafer W between the third block G3 and the fourth block G4.

The shuttle transfer apparatus 71 is configured to be linearly movable, for example, in the Y-direction in FIG. 3. The shuttle transfer apparatus 71 can move in the Y-direction while supporting the wafer W, and transfer the wafer W between the delivery unit 50 in the third block G3 and the delivery unit 60 in the fourth block G4 which are at the height of the same level.

As illustrated in FIG. 1, a wafer transfer apparatus 72 is provided on the X-direction positive direction side of the third block G3. The wafer transfer apparatus 72 has a transfer arm movable, for example, in the front-back direction, the θ-direction, and the up-down direction. The wafer transfer apparatus 72 can move up and down while supporting the wafer W to transfer the wafer W to each of the delivery units in the third block G3.

In the interface station 5, a wafer transfer apparatus 73 is provided. The wafer transfer apparatus 73 has a transfer arm movable, for example, in the front-back direction, the θ-direction, and the up-down direction. The wafer transfer apparatus 73, for example, can transfer the wafer W to/from each of the delivery apparatuses in the fourth block G4 and the etching station 4 while supporting the wafer W by the transfer arm.

In the etching station 4, as illustrated in FIG. 2, ultraviolet treatment units 80 each of which performs an ultraviolet irradiation treatment on the wafer W as an ultraviolet treatment section are provided at four tiers each in two rows.

Figure 4:
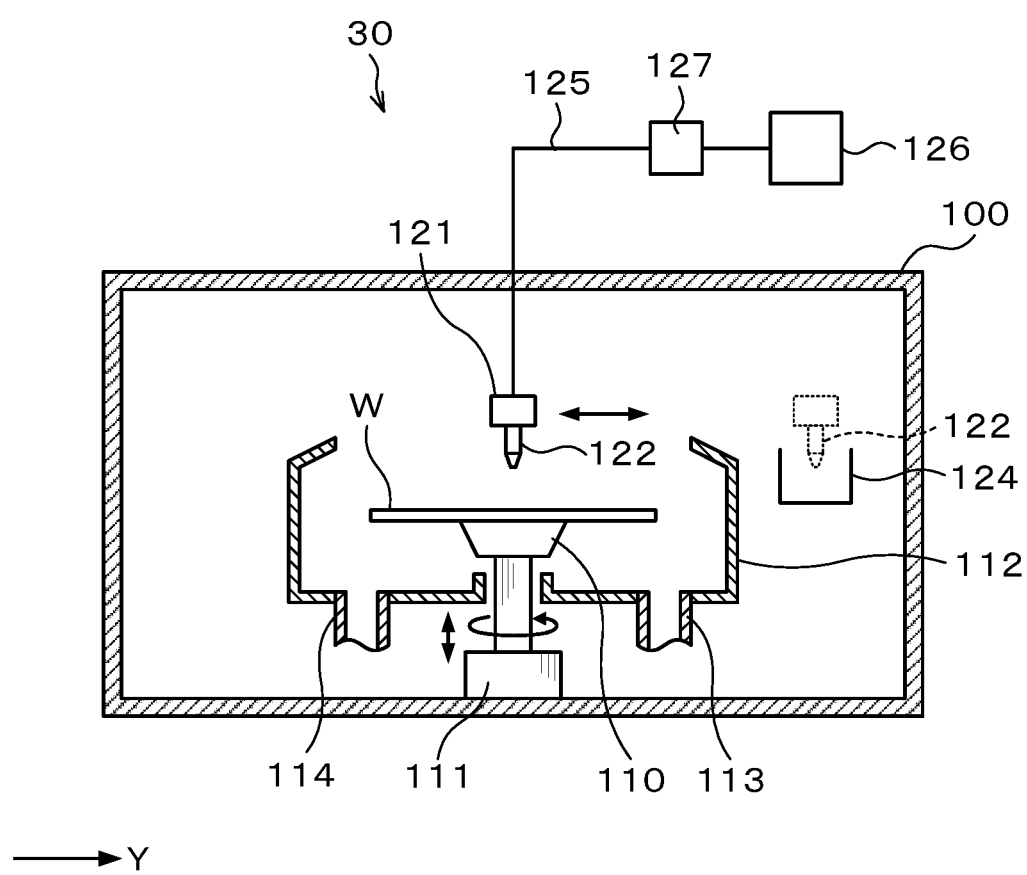
FIG. 4 is a longitudinal sectional view illustrating the outline of a configuration of a coating treatment unit.

Next, the configuration of the aforementioned coating treatment unit 30 will be explained. The coating treatment unit 30 has a treatment container 100 whose inside is sealable as illustrated in FIG. 4. A side surface on the wafer transfer apparatus 70 side of the treatment container 100 is formed with a transfer-in/out port (not illustrated) for the wafer W, and an opening and closing shutter (not illustrated) is provided at the transfer-in/out port.

At a central portion in the treatment container 100, a spin chuck 110 which holds and rotates the wafer W is provided. The spin chuck 110 has a horizontal upper surface, and the upper surface is provided with, for example, a suction port (not illustrated) for sucking the wafer W. By suction through the suction port, the wafer W can be suction-held on the spin chuck 110.

Below the spin chuck 110, a chuck drive 111 including, for example, a motor is provided. The spin chuck 110 can rotate at a predetermined speed by the chuck drive 111. Further, the chuck drive 111 is provided with, for example, a raising and lowering drive source such as a cylinder so that the spin chuck 110 freely rises and lowers.

Around the spin chuck 110, a cup 112 is provided which receives and collects liquid splashing or dropping from the wafer W. A drain pipe 113 which drains the collected liquid and an exhaust pipe 114 which evacuates and exhausts the atmosphere in the cup 112 are connected to the lower surface of the cup 112.

Figure 5:
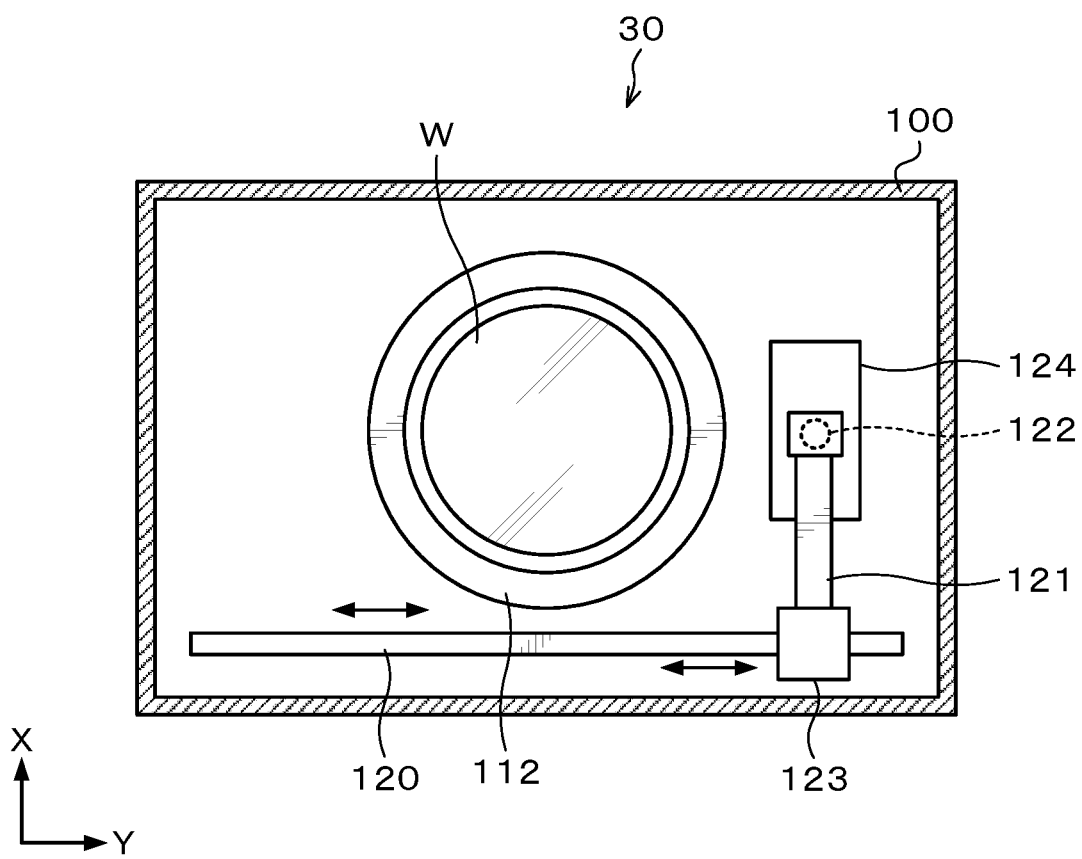
FIG. 5 is a transverse sectional view illustrating the outline of the configuration of the coating treatment unit.

As illustrated in FIG. 5, on an X-direction negative direction (lower direction in FIG. 5) side of the cup 112, a rail 120 is formed which extends along a Y-direction (right-left direction in FIG. 5). The rail 120 is formed, for example, from an outer position on the Y-direction negative direction (left direction in FIG. 5) side to an outer position on the Y-direction positive direction (right direction in FIG. 5) side of the cup 112. To the rail 120, an arm 121 is attached.

On the arm 121, a coating nozzle 122 which supplies the organic material onto the wafer W is supported as illustrated in FIG. 4 and FIG. 5. The arm 121 is movable on the rail 120 by a nozzle drive 123 illustrated in FIG. 5. This allows the coating nozzle 122 to move from a waiting section 124 provided at an outer position on the Y-direction positive direction side of the cup 112 to a position above a center of the wafer W in the cup 112 and further move in a diameter direction of the wafer W above the wafer W. The arm 121 is movable up and down by the nozzle drive unit 123, and is able to adjust the height of the coating nozzle 122.

To the coating nozzle 122, a supply pipe 125 is connected which supplies the organic material to the coating nozzle 122 as illustrated in FIG. 4. The supply pipe 125 communicates with an organic material supply source 126 which stores the organic material therein. Further, the supply pipe 125 is provided with a supply equipment group 127 including a valve, a flow regulator and so on for controlling the flow of the organic material.

Figure 6:
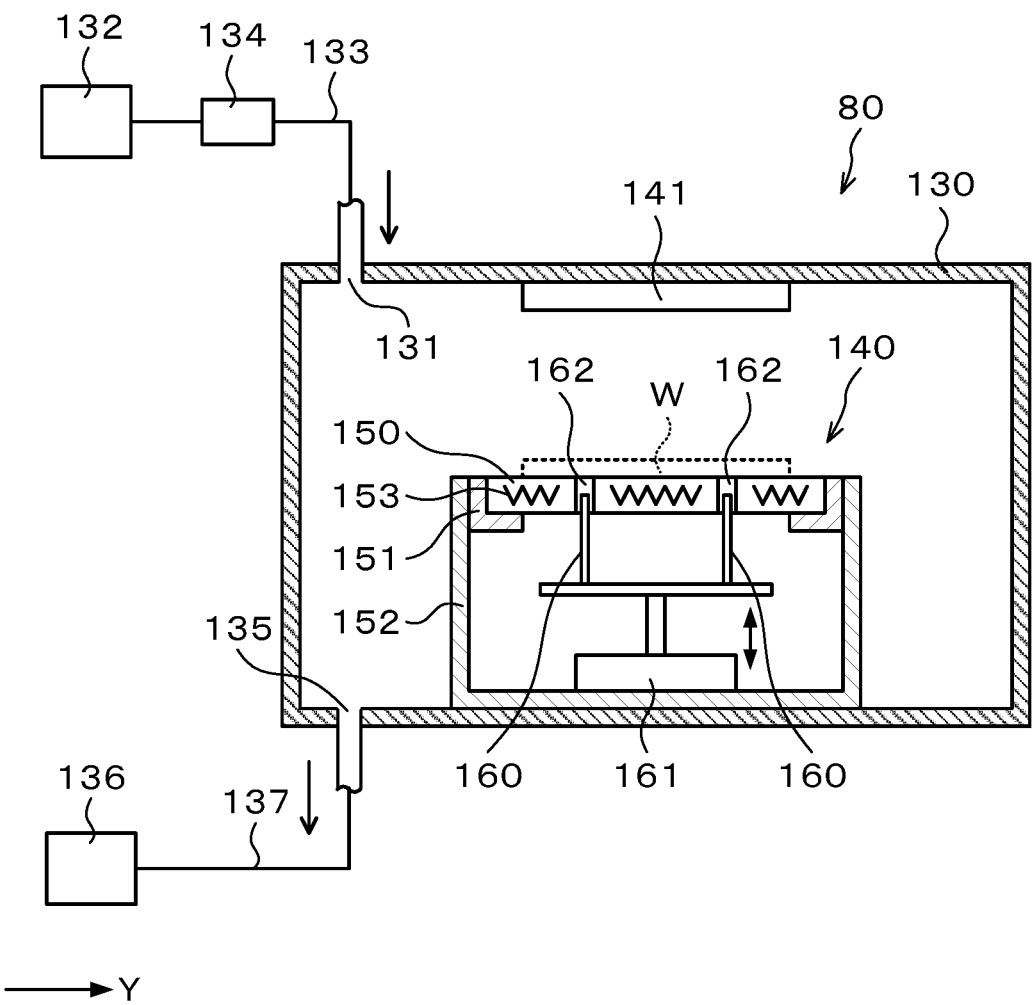
FIG. 6 is a longitudinal sectional view illustrating the outline of a configuration of an ultraviolet treatment unit.
Figure 7:
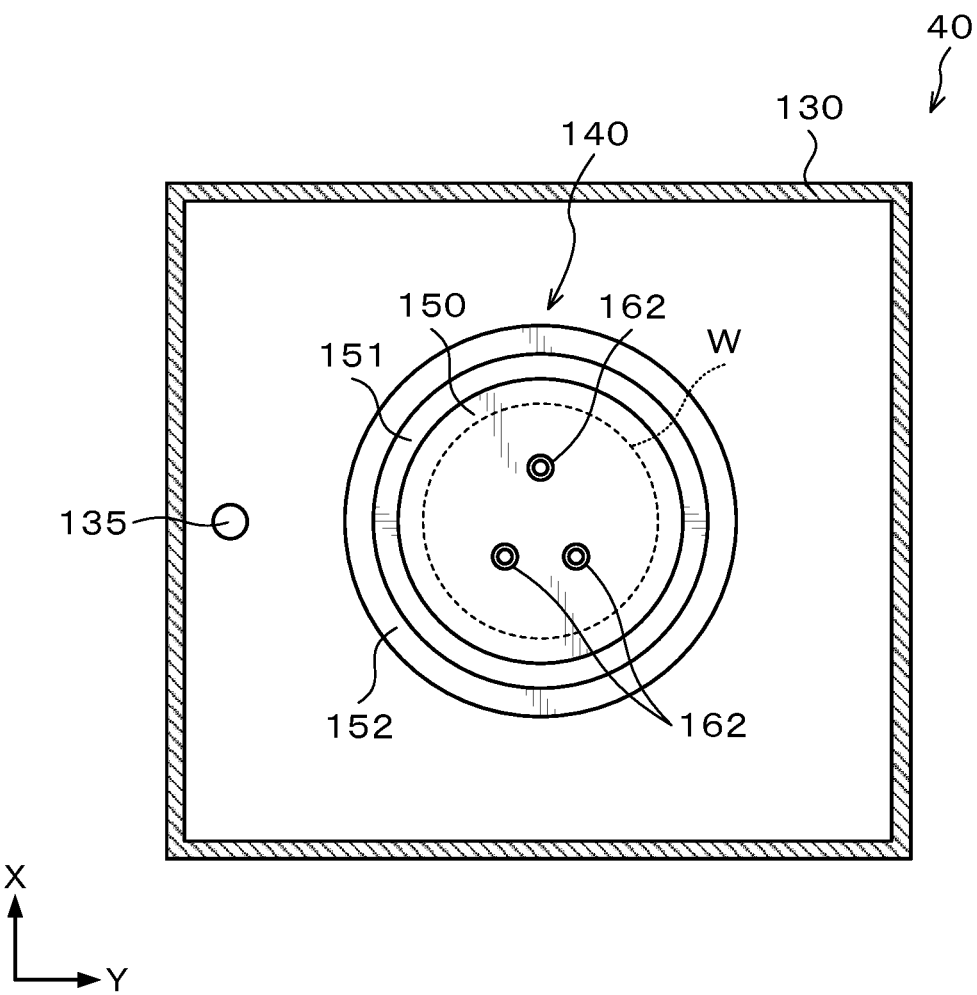
FIG. 7 is a transverse sectional view illustrating the outline of the configuration of the ultraviolet treatment unit.

Next, the configuration of the aforementioned ultraviolet treatment unit 80 will be explained. The ultraviolet treatment unit 80 has a treatment container 130 whose inside is closable as illustrated in FIG. 6 and FIG. 7. A side surface on the wafer transfer apparatus 73 side of the treatment container 130 is formed with a transfer-in/out port (not illustrated) for the wafer W, and an opening and closing shutter (not illustrated) is provided at the transfer-in/out port.

On a ceiling of the treatment container 130, a gas supply port 131 is formed which supplies, for example, an oxidizing gas into the treatment container 130. To the gas supply port 131, a gas supply pipe 133 communicating with a gas supply source 132 is connected. The gas supply pipe 133 is provided with a supply equipment group 134 including a valve, a flow regulator and so on for controlling the flow of the oxidizing gas.

Note that for the oxidizing gas, gas with an oxygen concentration higher than that of ordinary air is used in this embodiment. However, it is adoptable to bring the inside of the treatment container 130 into an air atmosphere without supplying a specific gas into the treatment container 130. In this case, the gas supply port 131, the gas supply source 132, the gas supply pipe 133, and the supply equipment group 134 may be omitted.

A bottom of the treatment container 130 is formed with a suction port 135 which sucks the atmosphere inside the treatment container 130. To the suction port 135, a suction pipe 137 communicating with a negative pressure generating apparatus 136 such as, for example, a vacuum pump is connected.

Inside the treatment container 130, a thermal treatment part 140 and an ultraviolet irradiator 141 are provided. The ultraviolet irradiator 141 is provided above the thermal treatment part 140.

The thermal treatment part 140 heats the organic film on the wafer W when an ultraviolet irradiation treatment by the ultraviolet irradiator 141 is performed on the wafer W after the thermal treatment by the thermal treatment unit 40 is performed and the organic film is formed.

The thermal treatment part 140 includes an annular holding member 151 which accommodates a hot plate 150 and holds the outer periphery of the hot plate 150, and a substantially cylindrical support ring 152 which surrounds the outer periphery of the holding member 151. The hot plate 150 has an almost disk shape with a large thickness, and can mount and heat the wafer W thereon. The hot plate 150 further has, for example, a heating mechanism 153 built therein. For the heating mechanism 153, for example, a heater is used. The heating temperature of the hot plate 150 is controlled, for example, by the controller 6 so that the wafer W mounted on the hot plate 150 is heated to a predetermined temperature.

Below the hot plate 150, for example, three raising and lowering pins 160 for supporting the wafer W from below and raising and lowering the wafer W are provided. The raising and lowering pins 160 can move up and down by a raising and lowering drive 161. Near the center of the hot plate 150, through holes 162 penetrating the hot plate 150 in the thickness direction thereof are formed, for example, at three positions. The raising and lowering pins 160 pass through the through holes 162 and are able to project from the upper surface of the hot plate 150.

The ultraviolet irradiator 141 radiates ultraviolet rays having a wavelength of, for example, 172 nm. Then, after the thermal treatment is performed at the thermal treatment part 140, the ultraviolet irradiator 141 performs an ultraviolet irradiation treatment on the organic film on the wafer W. Note that the ultraviolet irradiator 141 is provided and supported on the ceiling of the treatment container 130 in the illustrated example, but the ultraviolet irradiator 141 may be provided on a glass window (not illustrated) provided on the ceiling of the treatment container 130. In this case, the ultraviolet rays radiated from the ultraviolet irradiator 141 enter the inside of the treatment container 130 through the glass window.

Note that the thermal treatment unit 40 is to heat the organic material applied on the wafer W in the coating treatment unit 30 so as to form the organic film on the wafer W. The thermal treatment unit 40 has substantially the same structure as that of the above-explained ultraviolet treatment unit 80 and is different from the ultraviolet treatment unit 80 only in the structure relating to the ultraviolet irradiator 141 and the supply and exhaust of the oxidizing gas, and therefore the explanation of the configuration of the thermal treatment unit 40 will be omitted.

Figure 8:
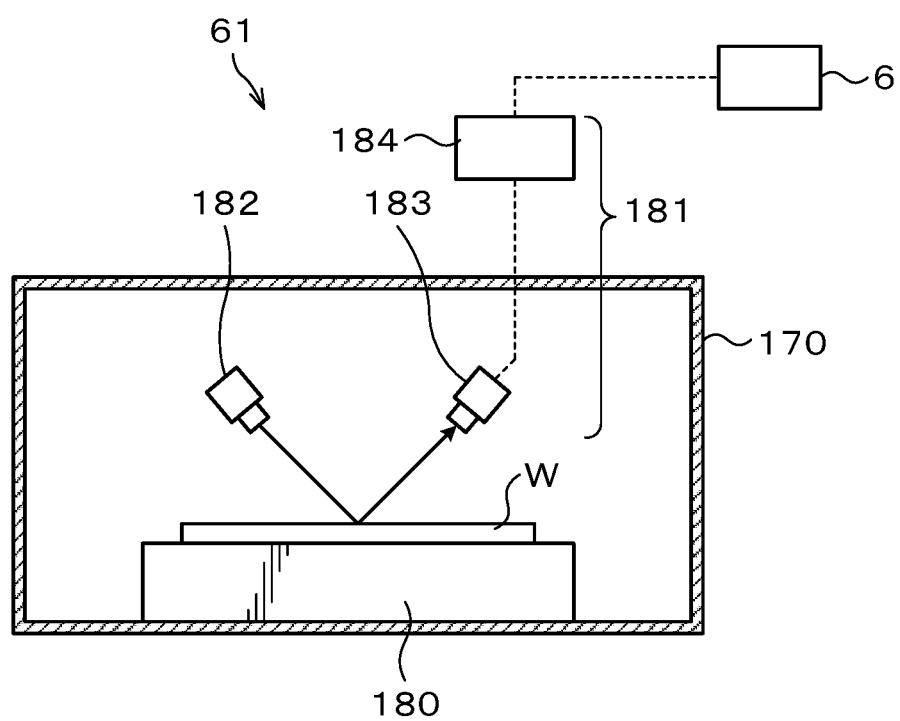
FIG. 8 is a transverse sectional view illustrating the outline of a configuration of a first film thickness measurement unit.

Next, the configuration of the aforementioned first film thickness measurement unit 61 will be explained. The first film thickness measurement unit 61 has a casing 170 whose inside is closable as illustrated in FIG. 8.

At a bottom of the casing 170, a stage 180 on which the wafer W is mounted, and an optical surface shape measuring device 181 are provided. The stage 180 can move, for example, in two-dimensional directions being horizontal directions. The optical surface shape measuring device 181 has a light irradiator 182 which irradiates the wafer W with light, for example, from an oblique direction, a light detector 183 which detects light radiated from the light irradiator 182 and reflected from the wafer W, and a measurer 184 which calculates the film thickness of an organic film F on the wafer W based on light reception information by the light detector 183. The first film thickness measurement unit 61 is to measure the film thickness of the organic film F using, for example, the Scatterometry method, and can measure the film thickness of the organic film F in the measurer 184 by collating the light intensity distribution within the wafer detected by the light detector 183 with a virtual light intensity distribution stored in advance and finding the film thickness of the organic film F corresponding to the collated virtual light intensity distribution.

In the first film thickness measurement unit 61, the wafer W is first mounted on the stage 180. Subsequently, the wafer W is irradiated with light from the light irradiator 182, and its reflected light is detected by the light detector 183. Then, in the measurer 184, the film thickness of the organic film F on the wafer W is measured. The film thickness measurement result of the organic film F is outputted to the controller 6.

Figure 9:
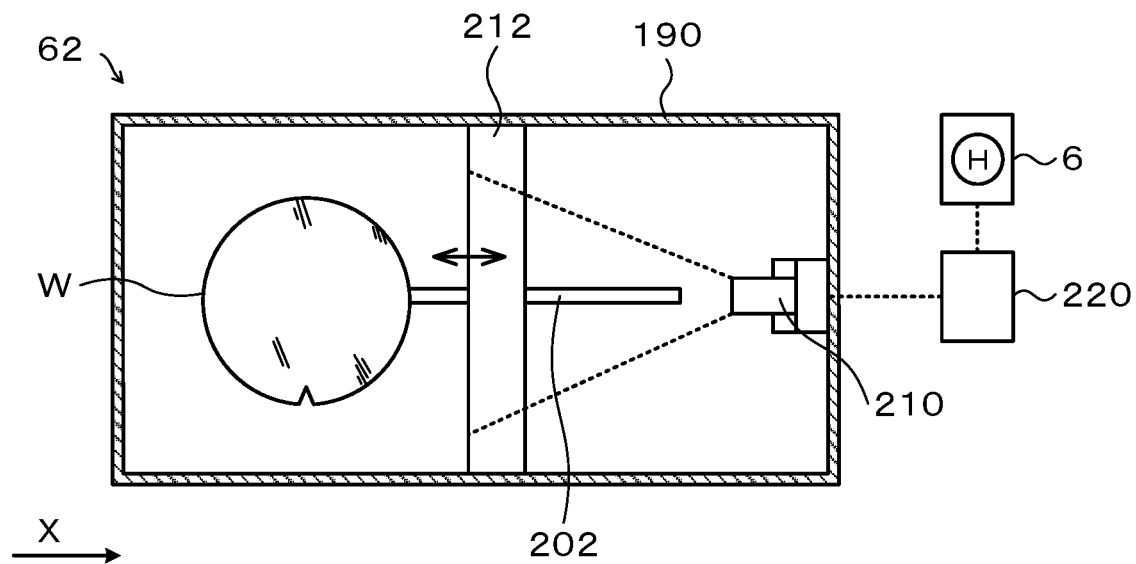
FIG. 9 is a longitudinal sectional view illustrating the outline of a configuration of a second film thickness measurement unit.
Figure 10:
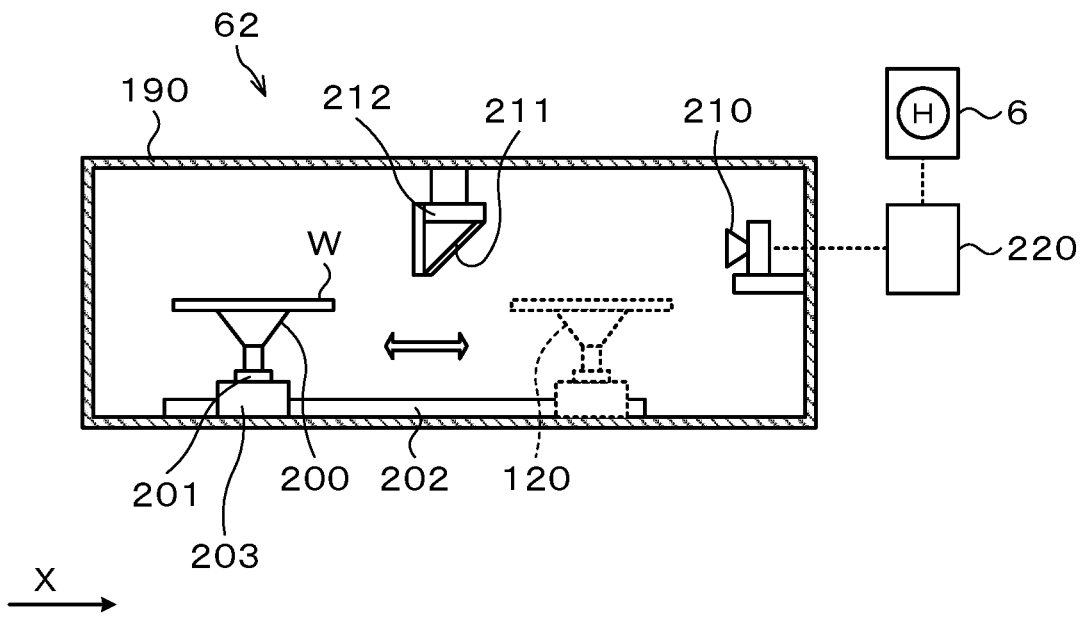
FIG. 10 is a transverse sectional view illustrating the outline of the configuration of the second film thickness measurement unit.

Next, the configuration of the aforementioned second film thickness measurement unit 62 will be explained. The second film thickness measurement unit 62 has a casing 190 as illustrated in FIG. 9 and FIG. 10. In the casing 190, a stage 200 on which the wafer W is mounted is provided. The stage 200 freely rotates and stops by a rotation drive 201 such as a motor. At a bottom of the casing 190, a guide rail 202 is provided from one end side (near an X-direction negative direction side in FIG. 10) to another end side (an X-direction positive direction side in FIG. 10) in the casing 190. The stage 200 and the rotation drive 201 are provided on the guide rail 202 and can move along the guide rail 202 by a drive apparatus 203.

On a side surface on the other end side (X-direction positive direction side in FIG. 10) in the casing 190, an imaging apparatus 210 is provided. For the imaging apparatus 210, for example, a wide-angle CCD camera is used.

Near the middle of the top of the casing 190, a half mirror 211 is provided. The half mirror 211 is provided at a position facing the imaging apparatus 210 in such a state that its mirror surface is inclined upward at 45 degrees toward the imaging apparatus 210 from a state of being directed vertically downward. Above the half mirror 211, an illumination apparatus 212 is provided. The half mirror 211 and the illumination apparatus 212 are fixed to the upper surface in the casing 190. The illumination from the illumination apparatus 212 passes through the half mirror 211 and is applied downward. Accordingly, light reflected from an object existing below the illumination apparatus 212 is further reflected from the half mirror 211 and captured into the imaging apparatus 210. In other words, the imaging apparatus 210 can image the object existing within an irradiation region by the illumination apparatus 212. Then, the captured image of the wafer W is inputted into a measurer 220. The measurer 220 calculates (measures) the film thickness of the organic film F on the wafer W on the basis of the imaging result in the imaging apparatus 210.

The method of calculating the film thickness of the organic film F in the measurer 220 is as follows for instance. Specifically, for the organic film having a non-uniform thickness formed on a measurement preparation wafer, measurement at points on the measurement preparation wafer is performed in advance to acquire film thickness measured values and coordinates corresponding to the film thickness measured values. Then, from a measurement preparation captured image obtained by imaging the measurement preparation wafer in the imaging apparatus 210 in advance, pixel values at the acquired respective coordinates are extracted. Thereafter, correlation data between the pixel values extracted at the respective coordinates and the film thickness measured values at the respective coordinates is generated. Then, in calculation (measurement) of the film thickness, the captured image of the wafer W being a film thickness measurement object is acquired, and a film thickness of the organic film formed on the wafer being the film thickness measurement object is calculated based on the pixel values of the captured image and the correlation data.

The aforementioned controller 6 is, for example, a computer including a program storage (not illustrated). In the program storage, a program for executing the film formation treatment in the film forming system 1 is stored. Note that the program may be the one that is recorded, for example, in a computer-readable storage medium H such as a computer-readable hard disk (HD), flexible disk (FD), compact disk (CD), magneto-optical disk (MO), or memory card, and installed from the storage medium H into the controller 6.

Figure 11:
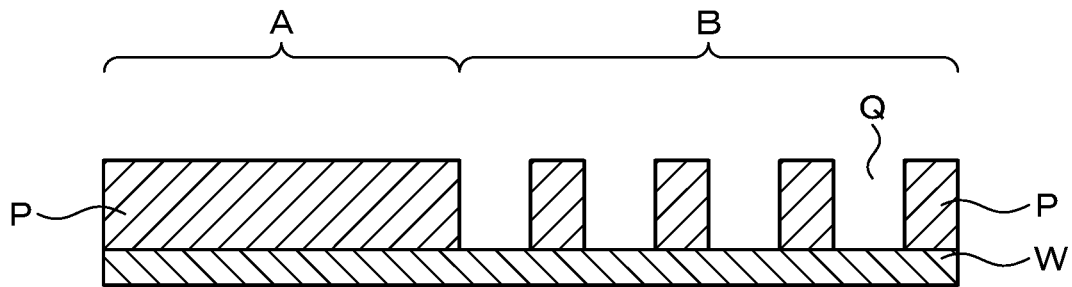
FIG. 11 is an explanatory view illustrating a state of a wafer before treated in the film forming system.

The film forming system 1 according to this embodiment is configured as explained above. Next, the same method as that in the prior art of film forming methods for the organic film using the film forming system 1 will be explained. FIG. 11 illustrates a state of the wafer W before treated in the film forming system 1, and FIG. 12 illustrates states of the wafer W at steps of the film forming method.

On the wafer W to be treated in the film forming system 1, predetermined patterns P of a $SiO_2$ film or the like have been formed in advance as illustrated in FIG. 11. The patterns P are sparsely and densely formed on the wafer W, and a first region A where the film (pattern P) covers the surface of the wafer W without formation of a recessed part in the pattern P and a second region B where recessed parts Q are formed between patterns P and P, are formed on the wafer W. In other words, the first region A is a so-called blanket region and the second region B is a region where, for example, line-and-space patterns P are formed.

First, the wafer W is taken out of the cassette C on the cassette stage 12 by the wafer transfer apparatus 21 and transferred to the delivery unit 50 in the processing station 3.

Then, the wafer W is transferred by the wafer transfer apparatus 70 to the coating treatment unit 30. The wafer W transferred into the coating treatment unit 30 is delivered from the wafer transfer apparatus 70 to the spin chuck 110 and is suction-held thereon. Subsequently, the arm 121 moves the coating nozzle 122 at the waiting section 124 to a position above the center of the wafer W. Thereafter, while the spin chuck 110 is rotating the wafer W, the organic material is supplied from the coating nozzle 122 onto the wafer W. The supplied organic material is diffused over the entire surface of the wafer W by the centrifugal force, whereby the top of the wafer W is coated with the organic material (Step S1).

Figure 12A:
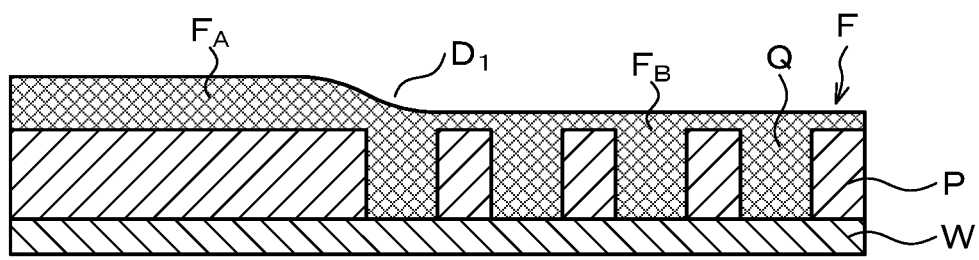
FIG. 12A is an explanatory view illustrating a state of the wafer at each step of a film formation treatment, and illustrates an appearance in which an organic film is formed on a wafer.

The wafer W is then transferred by the wafer transfer apparatus 70 to the thermal treatment unit 40. At this time, the wafer W transferred into the thermal treatment unit 40 is heated to a predetermined temperature, for example, 300° C. When the wafer W is heated for a predetermined time, the organic material on the wafer W is heated, so that an organic film F is formed on the wafer W as illustrated in FIG. 12A (Step S2). Note that between the organic film F in the first region A (hereinafter, referred to as an "organic film $F_A$" in some cases) and the organic film F in the second region B (hereinafter, referred to as an "organic film $F_B$" in some cases), a level difference $D_1$ is caused. The level difference $D_1$ is caused from the surface tension and viscosity of the organic material applied on the wafer W, the difference in contraction amount of the organic material in heating or the like.

Thereafter, the wafer W is transferred by the wafer transfer apparatus 70 to the delivery unit 60 in the fourth block G4. Then, the wafer W is transferred by the wafer transfer apparatus 73 to the ultraviolet treatment unit 80. In this event, inside the ultraviolet treatment unit 80, a normal pressure atmosphere of the oxidizing gas is maintained. The wafer W transferred into the ultraviolet treatment unit 80 is transferred to the thermal treatment part 140, and delivered to the raising and lowering pins 160 which have been raised and waiting in advance. Subsequently, the raising and lowering pins 160 are lowered to mount the wafer W on the hot plate 150. The wafer W on the hot plate 150 is heated to a predetermined temperature, for example, 300° C.

When the wafer W is mounted on the hot plate 150, the ultraviolet irradiator 141 radiates ultraviolet rays having a wavelength of 172 nm. The radiated ultraviolet rays generate active oxygen and ozone in the treatment atmosphere of the oxidizing gas in the treatment container 130. The active oxygen and ozone decompose and remove the surface of the organic film F (Step S3). In short, etch back of the organic film F is performed.

Figure 12B:
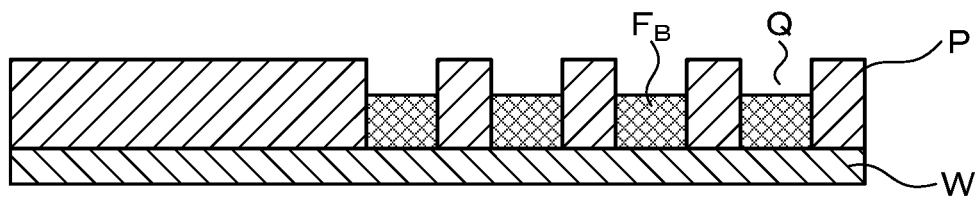
FIG. 12B is an explanatory view illustrating a state of the wafer at each step of the film formation treatment, and illustrates an appearance in which an ultraviolet irradiation treatment has been performed to remove a surface of the organic film.

As described above, the removal of the surface of the organic film F is performed by radiating the ultraviolet rays from the ultraviolet irradiator 141 while heating the organic film F by the hot plate 150. Further, the removal of the surface of the organic film F is performed down to a predetermined depth where the organic film $F_A$ is completely removed as illustrated in FIG. 12B. Thus, the surface of the patterns P is exposed, so that the organic film $F_A$ does not exist in the first region A and the organic film $F_B$ exists in the recessed parts Q between the patterns P in the second region B.

Note that heating the organic film F at the time when the ultraviolet treatment is performed by the ultraviolet irradiator 141 makes it possible to efficiently remove the surface of the organic film F in a short time.

Further, a peak wavelength of the wavelength of the ultraviolet rays radiated from the ultraviolet irradiator 141 is 172 nm in this embodiment but is not limited to this wavelength. The ultraviolet rays only need to have a peak wavelength of 200 nm or less and may have, for example, 193 nm. The ultraviolet rays having a peak wavelength of 172 nm or 193 nm can efficiently generate active oxygen and ozone.

Figure 12C:
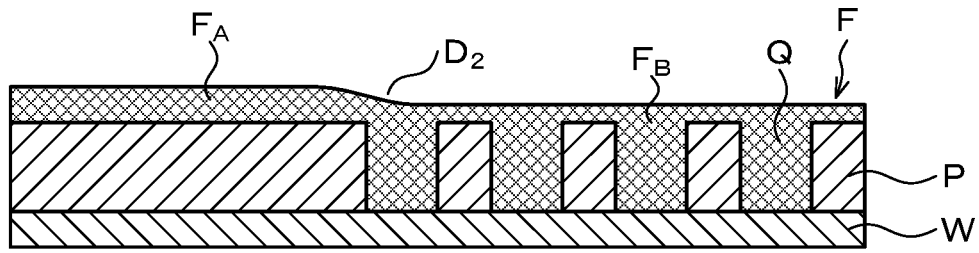
FIG. 12C is an explanatory view illustrating a state of the wafer at each step of the film formation treatment, and illustrates an appearance in which an organic film is formed on the organic film from which a surface has been removed.

Thereafter, the wafer W is returned by the wafer transfer apparatus 73 to the delivery unit 60 and transferred by the wafer transfer apparatus 70 again to the coating treatment unit 30, the organic material in a predetermined film thickness is applied onto the wafer W in the coating treatment unit 30 as at the above Step S1, and the organic material on the wafer W is heated in the thermal treatment unit 40 as at the above Step S2 (Step S4). Thus, the organic film F is formed on the wafer W as illustrated in FIG. 12C. In this event, a level difference $D_2$ is caused between the organic film $F_A$ and the organic film $F_B$. However, the level difference $D_2$ is smaller than the initial level difference $D_1$. In other words, the surface of the organic film F is flattened.

The wafer W is then transferred by the wafer transfer apparatus 70 to the delivery unit 50 and returned by the wafer transfer apparatus 21 to the cassette C.

[Method of Deciding Treatment Conditions in an Ultraviolet Irradiation Treatment]

Figure 13:
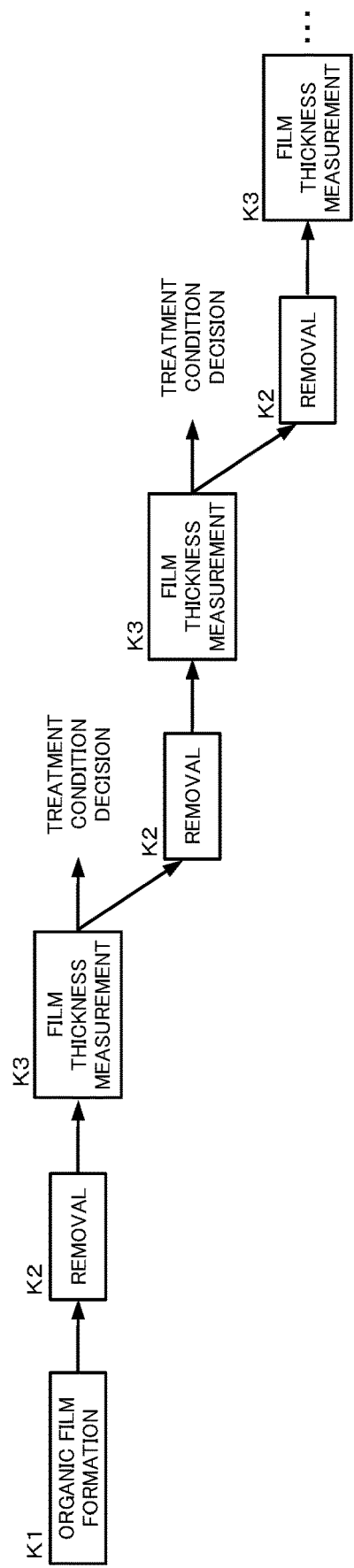
FIG. 13 is an explanatory diagram of a method of setting conditions of an ultraviolet irradiation treatment using the film forming system according to the first embodiment of the present invention.

Subsequently, a method of deciding treatment conditions in an ultraviolet irradiation treatment which can be performed in the film forming system 1 according to this embodiment, namely, a method of setting treatment conditions of an ultraviolet irradiation treatment will be explained. FIG. 13 is a schematic diagram for explaining the method of setting conditions of an ultraviolet irradiation treatment.

In setting the treatment conditions of the ultraviolet irradiation treatment, first, the top of the wafer W is coated with the organic material in a predetermined film thickness in the coating treatment unit 30 and the organic material on the wafer W is heated in the thermal treatment unit 40 as at the above Step S1 and Step S2, whereby an organic film is formed on the wafer W (organic film formation step K1).

Then, the ultraviolet irradiation treatment by the ultraviolet irradiator 141 is performed in the ultraviolet treatment unit 80 as at the above Step S3, whereby the surface of the organic film on the wafer W is removed (removal step K2). The treatment conditions in the first ultraviolet irradiation treatment, namely, the initial conditions in the ultraviolet irradiation treatment have been determined in advance. Note that the treatment conditions in the ultraviolet irradiation treatment are, for example, irradiation time, output (dose amount), oxygen concentration in the treatment container 130 and the like. The oxygen concentration as the treatment condition is decided to be within a range of 0.01 to 80%.

Then, the wafer W is transferred by the wafer transfer apparatus 73 to the first film thickness measurement unit 61 or the second film thickness measurement unit 62, and the film thickness of the organic film on the wafer W after the removal step K2 is measured in the first film thickness measurement unit 61 or 62 (film thickness measurement step K3).

When a predetermined condition (for example, the condition of the film thickness in the first region A of the wafer W being 0) is satisfied as a result of the measurement, the initial conditions are decided as the treatment conditions in the ultraviolet irradiation treatment.

Besides, when the predetermined condition is not satisfied as the result of the measurement, namely, when the organic film remains, for example, in the first region A of the wafer W, the above removal step K2 is performed again in which the wafer W is transferred again to the ultraviolet treatment unit 80 and the ultraviolet irradiation treatment by the ultraviolet irradiator 141 is performed in the ultraviolet treatment unit 80, whereby the surface of the organic film on the wafer W is further removed. The removal amount in this event, namely, the etch-back amount/etch-back time may be calculated from the thickness of the remaining organic film and the etching rate of the organic film or may be a predetermined time.

After the additional removal step K2, the film thickness measurement step K3 is performed in which the wafer W is transferred again to the first film thickness measurement unit 61 or the second film thickness measurement unit 62 and the film thickness of the organic film on the wafer W after the additional removal step K2, is measured.

The removal step K2 and the film thickness measurement step K3 are repeated until the wafer W satisfies the predetermined condition.

Then, when the predetermined condition comes to be satisfied, the sum of the ultraviolet irradiation time at the removal steps performed until then is decided as the treatment condition in the ultraviolet irradiation treatment.

As described above, in the film forming system 1, the setting of the treatment conditions in the ultraviolet irradiation treatment can be performed based on the film thickness measurement result in the first film thickness measurement unit 61 or the second film thickness measurement unit 62, namely, the film thickness measurement result using the method requiring no need to break the wafer W. Accordingly, the setting of the conditions can be easily performed in a short time. Further, the film thickness measurement method using the Scatterometry method and the captured image can measure the film thickness in an atmosphere at an atmospheric pressure, and therefore can reduce the manufacturing cost of the system.

Further, in the film forming system 1, an organic film formation section composed of the coating treatment units 30 and the thermal treatment units 40, a film thickness measurement section composed of the first film thickness measurement unit 61 and the second film thickness measurement unit 62, and an ultraviolet treatment section composed of the ultraviolet treatment units 80 are provided side by side in this order along the transfer direction of the wafer W. Accordingly, in the film forming system 1, the wafer W can be smoothly delivered in setting the conditions of the ultraviolet irradiation treatment, and therefore the time for condition setting can be further shortened.

Note that when the predetermined condition is satisfied as a result of the measurement at the film thickness measurement step, the organic film may be formed on the wafer W after the removal of the surface of the organic film as at the above Step S4.

(An Example of the Film Formation Method of the Organic Film in Mass Production Operation Using the Film Forming System 1)

Figure 14:
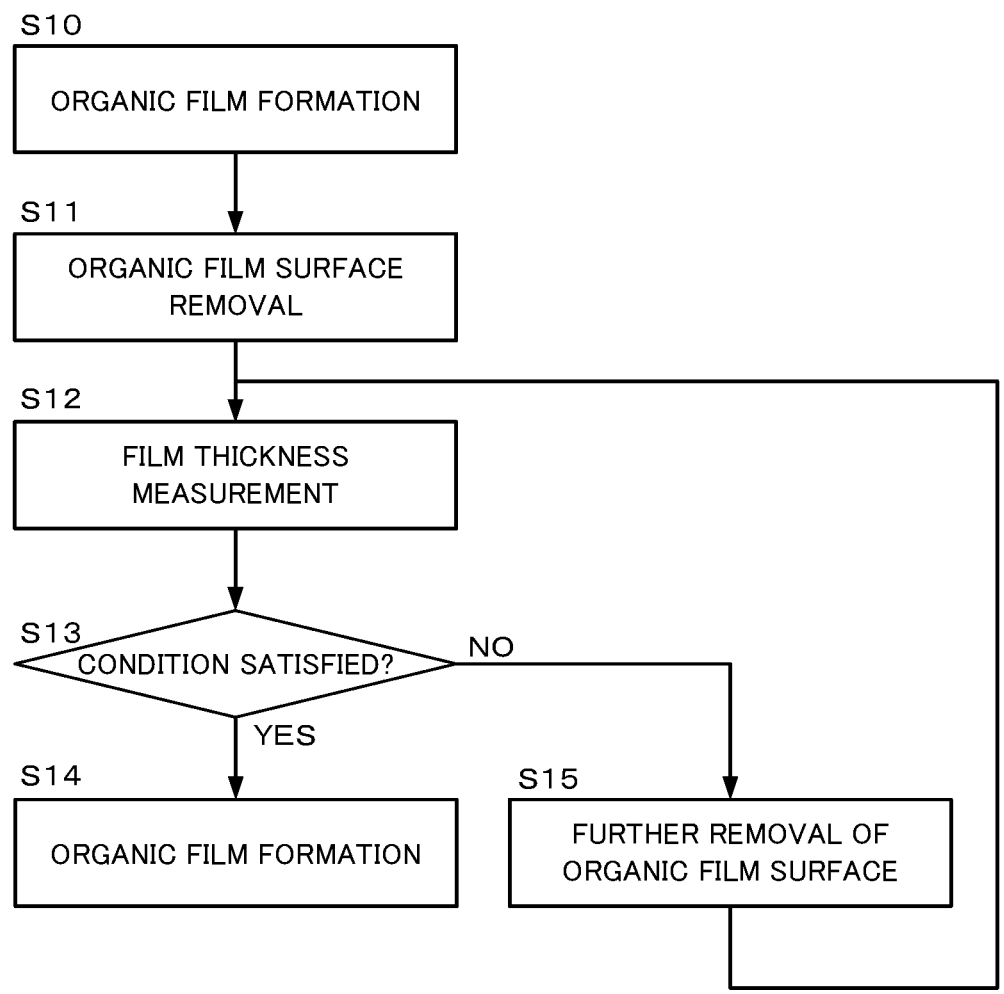
FIG. 14 is a flowchart for explaining an example of the film formation method using the film forming system according to the first embodiment of the present invention.

Subsequently, an example of the film formation method of the organic film in mass production operation using the film forming system 1 will be explained using FIG. 14.

During the mass production operation, first, the top of the wafer W is coated with the organic material in a predetermined film thickness in the coating treatment unit 30, and the organic material on the wafer W is heated in the thermal treatment unit 40 as at the above Step S1 and Step S2, whereby an organic film is formed on the wafer W (Step S10).

Then, the ultraviolet irradiation treatment by the ultraviolet irradiator 141 is performed in the ultraviolet treatment unit 80 as at the above Step S3, whereby the surface of the organic film on the wafer W is removed (Step S11).

Then, the wafer W is transferred by the wafer transfer apparatus 73 to the first film thickness measurement unit 61 or the second film thickness measurement unit 62, and the film thickness of the organic film on the wafer W after the removal step is measured in the film thickness measurement unit 61, 62 (Step S12). Note that the method based on the captured image is capable of measuring the film thickness in a shorter time, and therefore the wafer W is preferably transferred to the second film thickness measurement unit 62.

Then, whether or not the result of the measurement satisfies a predetermined condition (for example, the condition of the film thickness in the first region A of the wafer W being 0) is determined (Step S13).

When the film thickness in the first region A of the wafer W is 0 as the result of the measurement, namely, when the predetermined condition is satisfied, an organic film is formed on the wafer W after the surface of the organic film is removed as at the above Step S4 (Step S14).

Besides, when the organic film remains in the first region A of the wafer W as the result of the measurement, namely, when the predetermined condition is not satisfied, the wafer W is transferred again to the ultraviolet treatment unit 80 and the ultraviolet irradiation treatment by the ultraviolet irradiator 141 is performed in the ultraviolet treatment unit 80, whereby the surface of the organic film on the wafer W is further removed (Step S15), namely, the additional removal step is performed. The removal amount in this event, namely, the etch-back amount/etch-back time can be calculated from the thickness of the remaining organic film and the etching rate of the organic film.

Step S15, namely, the additional removal step is performed until the result of the measurement satisfies the predetermined condition.

By this film formation method, the organic film on the wafer W can be surely removed, so that the film can be formed with a uniform quality.

(Another Example of the Film Formation Method of the Organic Film in Mass Production Operation Using the Film Forming System 1)

Subsequently, another example of the film formation method of the organic film in mass production operation using the film forming system 1 will be explained using FIG. 15.

The mass production operation includes a period when quality control (QC) is performed, namely, QC time, and a period when normal production is performed, namely, stationary time, and in each of the periods, the wafers W are treated in parallel. Note that the quality control period is provided for every lapse of a predetermined time and provided, for example, once a day, once a week, or once a month.

In the QC time during the mass production operation, an organic film is formed on each of the wafers W as at the above Steps S1 and S2 (organic film formation step K11).

Then, each of the wafers W is transferred by the wafer transfer apparatus 70 to the first film thickness measurement unit 61, and the film thickness of the organic film on each of the wafers W is measured (first film thickness measurement step K12).

After the measurement, the surface of the organic film on each of the wafers W is removed in the ultraviolet treatment unit 80 as at the above Step S3 (removal step K13).

After the removal, each of the wafers W is transferred by the wafer transfer apparatus 73 to the first film thickness measurement unit 61, and the film thickness of the organic film after the removal is measured (second film thickness measurement step K14).

After the measurement, an organic film is formed on the wafer W after the removal of the surface of the organic film as at the above Step S4 (additional organic film formation step K15).

After the additional organic film formation treatment, each of the wafers W is transferred by the wafer transfer apparatus 70 to the first film thickness measurement unit 61, and the film thickness of the organic film on the wafer W after the additional organic film formation treatment is measured (third film thickness measurement step K16).

Thereafter, the wafer W is transferred by the wafer transfer apparatus 70 to the delivery unit 50, and returned by the wafer transfer apparatus 21 to the cassette C.

The measurement result at the first film thickness measurement step K12 is fed back (FB) to the treatment conditions in the organic film formation treatment at the organic film formation step K11, more specifically, the treatment conditions are adjusted so that the film thickness of the organic film to be formed at the organic film formation step K11 becomes a predetermined value. The treatment conditions in this case are, for example, the discharge amount of the organic material and the rotation speed of the spin chuck (spin coater) 110.

Further, the measurement result at the second film thickness measurement step K14 is fed back (FB) to the treatment conditions in the ultraviolet irradiation treatment at the removal step K13, more specifically, the treatment condition is adjusted so that the film thickness of the organic film after the removal step K13 becomes a predetermined value. The treatment condition in this case is, for example, irradiation time of ultraviolet rays.

Further, the measurement result at the third film thickness measurement step K16 is fed back (FB) to the treatment conditions in the organic film formation treatment at the additional organic film formation step K15, more specifically, the treatment conditions are adjusted so that the film thickness of the organic film after the additional organic film formation step K15 becomes a predetermined value. The treatment conditions in this case are, for example, the discharge amount of the organic material and the rotation speed of the spin chuck 110.

Further, to prevent the film thickness of the organic film to be formed from differing among the modules, namely, differing among the units in the film forming system 1, correction of the treatment conditions at the organic film formation step K11, correction of the treatment conditions at the removal step K13, and correction of the treatment conditions at the additional organic film formation step K15 are performed.

The step in the stationary time during the mass production operation is the same as the step in the QC time during the mass production operation, but is different in the following points. More specifically, in the stationary time during the mass production operation, unlike in the QC time, the second film thickness measurement unit 62 is used at first to third film thickness measurement steps K12', K14', K16', and the measurement result in the unit 62 is fed back (FB) to the organic film formation step K11, the removal step K13, and the additional organic film formation step K15.

By the film formation method, the treatment conditions can be adjusted, so that the film can be formed with more uniform quality.

Further, the first film thickness measurement unit 61 capable of more accurately measuring the film thickness is used in the QC time and the second film thickness measurement unit 62 capable of more speedily measuring the film thickness is used in the stationary time, so that the quality control can be accurately performed and mass production of the film with uniform quality can be performed in a short time.

Note that the calculation/measurement result of the film thickness at the first film thickness measurement step K12' in the stationary time and the calculation/measurement result of the film thickness at the first film thickness measurement step K12 in the QC time can be correlated. Specifically, for example, from the correlation between the measurement result of the film thickness based on the captured image at the first film thickness measurement step K12' in the stationary time and the measurement result of the film thickness by the Scatterometry method at the first film thickness measurement step K12 in the QC time, the film thickness corresponding to each color of the captured image is corrected. This can eliminate the difference among the modules in the measurement result of the film thickness based on the captured image at the first film thickness measurement step K12' in the stationary time. Accordingly, the difference among the modules in film thickness of the organic film to be formed can be reduced in the film forming system 1. The same applies to the second film thickness measurement steps K14', K14, and to the third film thickness measurement steps K16', K16.

(Another Example of the Film Formation Method of the Organic Film in Mass Production Operation Using the Film Forming System 1)

Figure 15:
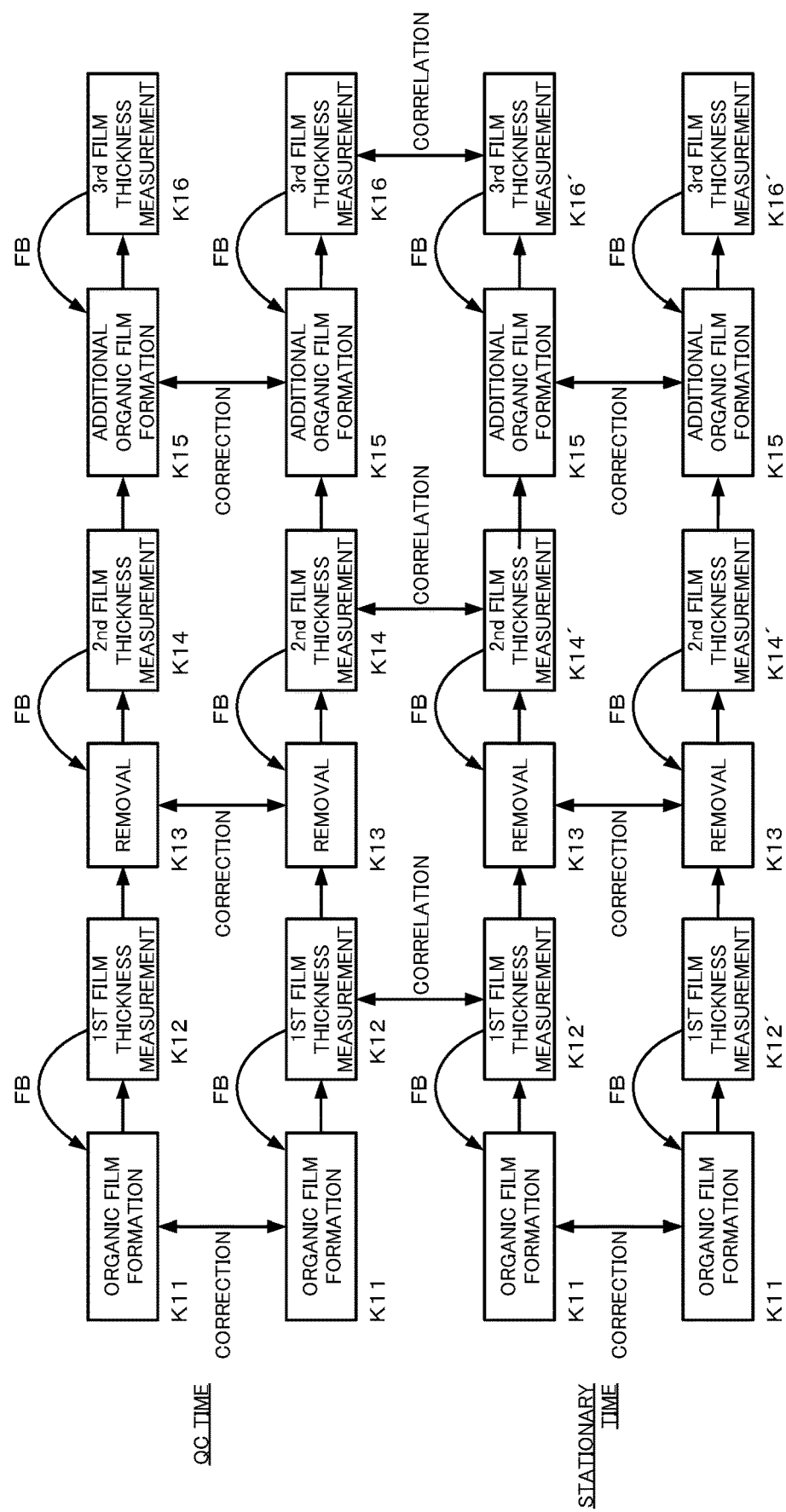
FIG. 15 is a conceptual diagram for explaining an example of the film formation method using the film forming system according to the first embodiment of the present invention.

In the example in FIG. 15, the film thickness of the organic film is measured after the organic film formation step K11, and the measurement result is fed back to the organic film formation step K11.

However, it is also adoptable to omit the film thickness measurement step between the organic film formation step K11 and the removal step K13, and feed back the measurement result at the film thickness measurement step between the removal step K13 and the additional organic film formation step K15 to the organic film formation step K11 without feeding back the measurement result to the removal step K13.

This can shorten the time required for the series of film formation treatment.

(Still Another Example of the Film Formation Method of the Organic Film in Mass Production Operation Using the Film Forming System 1)

Figure 16:
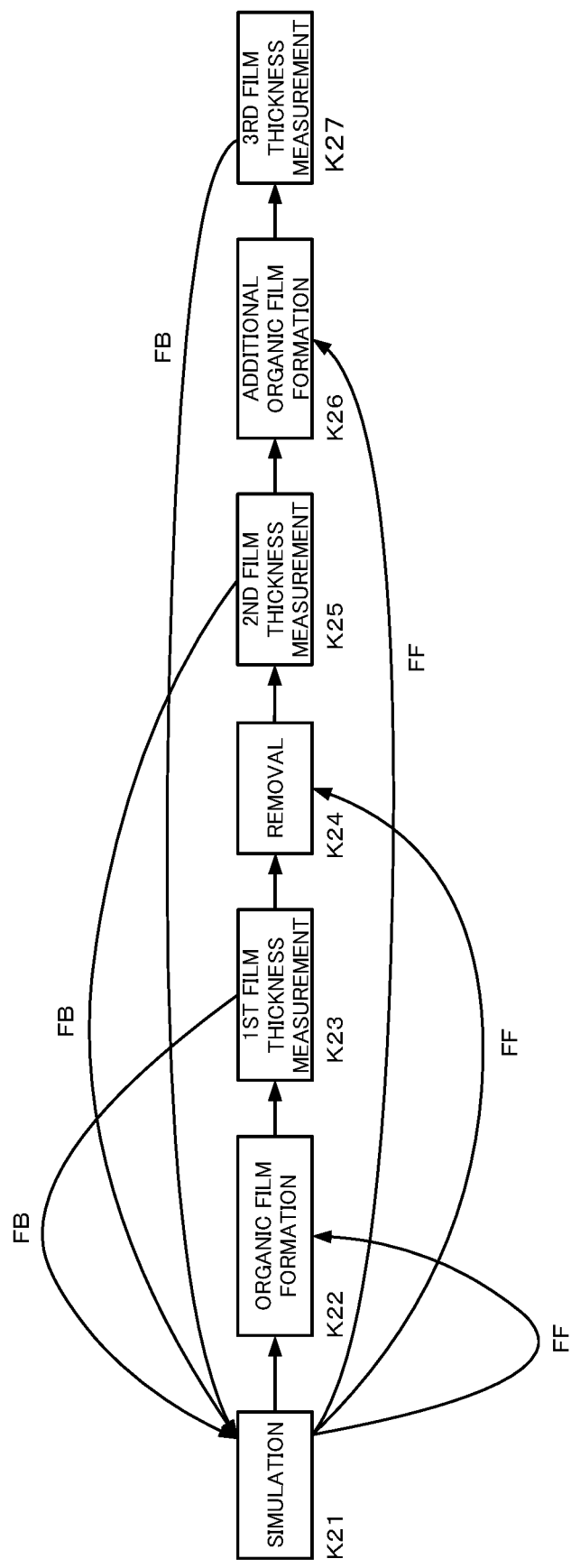
FIG. 16 is a conceptual diagram for explaining an example of the film formation method using the film forming system according to the first embodiment of the present invention.

Subsequently, another example of the film formation method of the organic film in mass production operation using the film forming system 1 will be explained using FIG. 16.

The treatment conditions suitable at the organic film formation step, the removal step, and the additional organic film formation step during the mass production operation are different depending on the kind of the patterns on the wafer W and the kind of the organic material being the raw material of the organic film, and are conventionally decided in advance by actually performing the steps and performing the condition setting of the above treatment conditions based on the results thereof.

In contrast to the above, the treatment conditions are not decided in advance but decided by a simulation based on information on the patterns on the wafer W in this method.

Specifically, in this method, the information on the patterns on the wafer W is inputted first, a simulation for obtaining an organic film in a predetermined shape is performed based on the information, and the treatment conditions are calculated (simulation step K21). The information on the patterns on the wafer W may be inputted from the external part or may be acquired from an image capturing result by an imaging apparatus capturing an image of the patterns on the wafer W which is provided in the film forming system 1.

The treatment conditions as the simulation result are fed forward (FF) to an organic film formation step K22, a removal step K24 and an additional organic film formation step K26.

Then, an organic film is formed on the wafer W based on the fed-forward treatment conditions as at the above Step S1 and Step S2 (organic film formation step K22).

Then, the wafer W is transferred by the wafer transfer apparatus 70 to the first film thickness measurement unit 61 or the second film thickness measurement unit 62, and the film thickness of the organic film on the wafer W is measured (film thickness measurement step K23).

After the measurement, the surface of the organic film on each of the wafers W is removed based on the fed-forward treatment conditions in the ultraviolet treatment unit 80 as at the above Step S3 (removal step K24).

After the removal, the wafer W is transferred by the wafer transfer apparatus 73 to the first film thickness measurement unit 61 or the second film thickness measurement unit 62, and the film thickness of the organic film after the removal is measured (second film thickness measurement step K25).

After the measurement, an organic film is formed on the wafer W after the removal of the surface of the organic film, based on the fed-forward treatment conditions as at the above Step S4 (additional organic film formation step K26).

After the additional organic film formation treatment, the wafer W is transferred by the wafer transfer apparatus 70 to the first film thickness measurement unit 61 or the second film thickness measurement unit 62, and the film thickness of the organic film on the wafer W after the additional organic film formation treatment is measured (third film thickness measurement step K27).

Thereafter, the wafer W is transferred by the wafer transfer apparatus 70 to the delivery unit 50, and returned by the wafer transfer apparatus 21 to the cassette C.

The measurement results at the first to third film thickness measurement steps K23, K25, K27 are fed back to the treatment conditions calculated at the simulation step K21.

This method can significantly shorten the time required for the condition setting of the treatment conditions and is therefore more suitable for mass production. Further, use of the simulation result can reduce the number of places for measuring the film thickness and thus can increase the efficiency of the film formation treatment.

(Another Method of Using the First Film Thickness Measurement Unit 61 and the Second Film Thickness Measurement Unit 62)

The first film thickness measurement unit 61 or the second film thickness measurement unit 62 may be used to measure the thickness of the coating film of the organic liquid on the wafer W after the coating treatment onto the wafer W in the coating treatment unit 30 and before the thermal treatment in the thermal treatment unit 40, and the treatment conditions in the thermal treatment in the thermal treatment unit 40 are adjusted based on the measurement result.

Further, the film thickness distribution of the organic film on the wafer W can be acquired from the measurement result in the first film thickness measurement unit 61 and the second film thickness measurement unit 62, so that the sparse/dense degree of the patterns P on the wafer can be determined.

Based on the sparse/dense degree and the film thickness measurement result, the condition setting and adjustment of the treatment conditions in the organic film formation treatment, the ultraviolet irradiation treatment, and the additional organic film formation treatment may be performed or another treatment may be performed.

Second Embodiment

Figure 17:
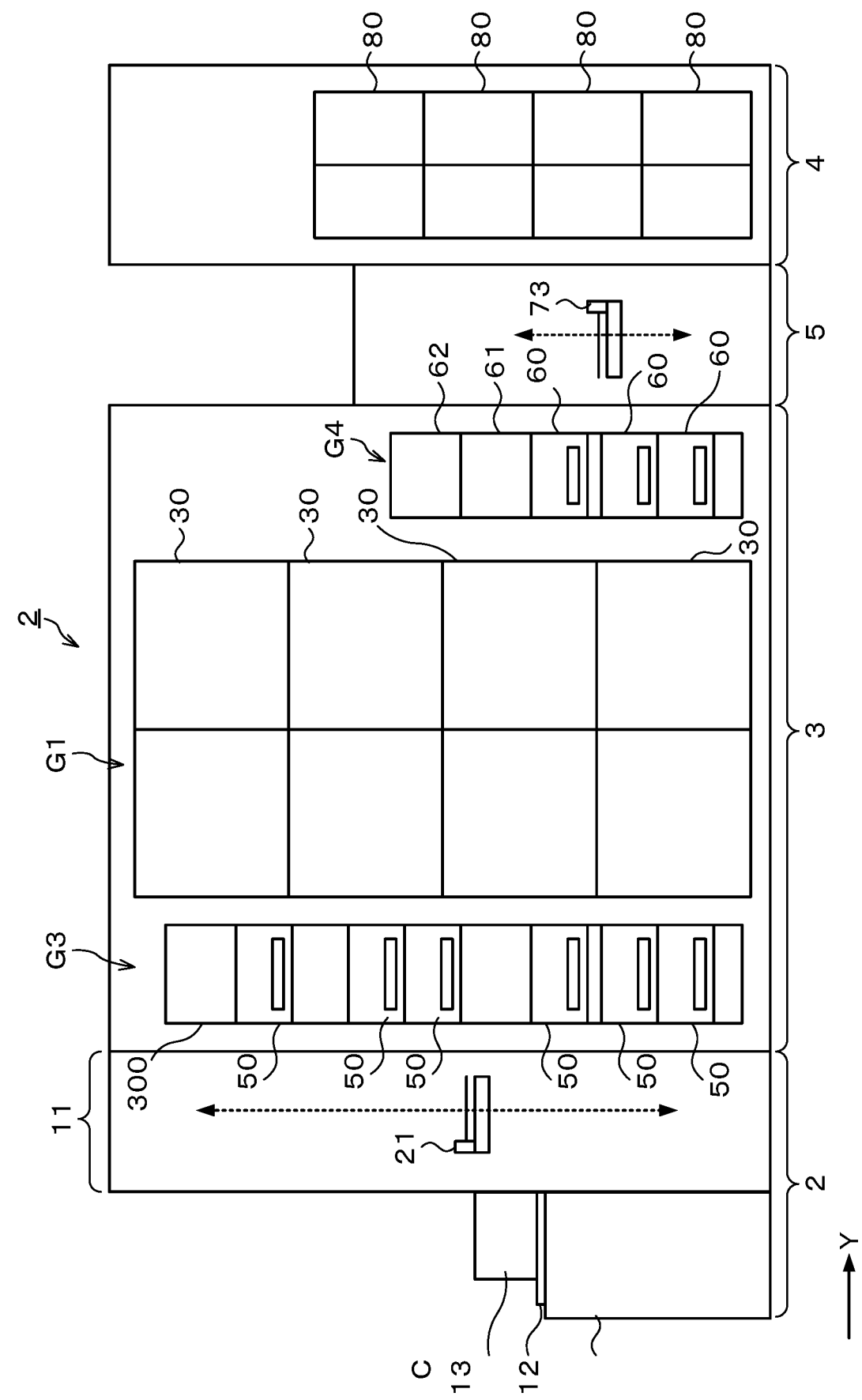
FIG. 17 is a side view illustrating the outline of an internal configuration of a film forming system according to a second embodiment of the present invention.

FIG. 17 is a side view illustrating the outline of an internal configuration of a film forming system 1 according to a second embodiment.

The film forming system 1 in FIG. 17, unlike the film forming system 1 in FIG. 1 or the like, includes another film thickness measurement unit 300 different from the first and second film thickness measurement units 61, 62. The another film thickness measurement unit 300 is disposed so that a substrate transfer in/out section composed of a cassette transfer in/out section 10, another film thickness measurement section composed of the another film thickness measurement unit 300, and an organic film formation section composed of coating treatment units 30 and thermal treatment units 40 are arranged side by side in this order along the transfer direction of the wafer W.

The another film thickness measurement unit 300 may be of a mode of measuring the film thickness using the Scatterometry method or a mode of measuring the film thickness based on a captured image.

The another film thickness measurement unit 300 is to measure the film thickness of the organic film on the wafer W immediately before it is ejected to the cassette transfer in/out section 10, and to evaluate the flatness of the surface of the organic film on the wafer W. In this film forming system 1, when the flatness is good, the wafer W is returned to the cassette C in the cassette transfer in/out section 10, whereas when the flatness is not good, the wafer W is ejected in another way.

Provision of the another film thickness measurement unit 300 at the aforementioned position allows delivery of the wafer W during the film formation treatment including the evaluation of the flatness to be smoothly performed, thereby shortening the time required for the film formation treatment per wafer.

Note that the explanation is made using the ultraviolet irradiation time as the example of the treatment condition of the ultraviolet irradiation treatment for the condition setting object and the adjustment object in the above, but the temperature of the wafer W during the ultraviolet irradiation treatment may be the condition setting object or the like in place of the ultraviolet irradiation time.

Besides, the organic film formation treatment on the same wafer W is performed up to twice in the above explanation, but the present invention is applicable also to the case of performing the organic film formation treatment three or more times.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

EXPLANATION OF CODES

1 . . . film forming system
6 . . . controller
10 . . . cassette transfer-in/out section
30 . . . coating treatment unit
40 . . . thermal treatment unit
61 . . . first film thickness measurement unit
62 . . . second film thickness measurement unit
80 . . . ultraviolet treatment unit
140 . . . thermal treatment part
141 . . . ultraviolet irradiator
300 . . . another film thickness measurement unit

What is claimed is:

1. A film forming system for forming an organic film on a substrate having a pattern formed on a surface thereof, the film forming system comprising:
   an organic film formation section configured to perform an organic film formation treatment on the substrate to form the organic film on the substrate;
   a film thickness measurement section configured to measure a film thickness of the organic film on the substrate;
   an ultraviolet treatment section configured to perform an ultraviolet irradiation treatment on the organic film on the substrate to remove a surface of the organic film; and
   a controller configured to control the organic film formation section, the film thickness measurement section, and the ultraviolet treatment section,
     wherein the controller is configured to perform control so that the film thickness measurement section measures a film thickness of the organic film which has been formed by the organic film formation treatment by the organic film formation section and from which the surface has been removed by the ultraviolet treatment section, and adjust a treatment condition in the organic film formation treatment based on a measurement result,
   wherein the film thickness measurement section includes a first measurement part configured to measure the film thickness using a Scatterometry method, and a second measurement part configured to measure the film thickness based on a captured image.

2. A film forming method of forming an organic film on a substrate having a pattern formed on a surface thereof, the film forming method comprising:
- performing an organic film formation treatment on the substrate to form the organic film on the substrate;
- removing a surface of the organic film formed by the organic film formation treatment, by an ultraviolet irradiation treatment;
- measuring a film thickness of the organic film on the substrate,
- wherein a treatment condition in the organic film formation treatment or in the ultraviolet irradiation treatment is adjusted based on a measurement result at the measuring the film thickness of the organic film,
- wherein the measuring the film thickness of the organic film includes measuring a film thickness of the organic film from which the surface has been removed by the ultraviolet irradiation treatment, and
- wherein the treatment condition in the organic film formation treatment is adjusted based on a measurement result at the measuring the film thickness of the organic film from which the surface has been removed by the ultraviolet irradiation treatment.

3. The film forming method according to claim 2, further comprising performing an additional organic film formation treatment on the organic film from which the surface has been removed,
- wherein the measuring the film thickness of the organic film includes measuring a film thickness of the organic film after the additional organic film formation treatment, and
- wherein a treatment condition in the additional organic film formation treatment is adjusted based on a measurement result at the measuring the film thickness of the organic film after the additional organic film formation treatment.

\* \* \* \* \*